United States Patent [19]

Leussler

[11] Patent Number: 5,216,368
[45] Date of Patent: Jun. 1, 1993

[54] QUADRATURE COIL SYSTEM

[75] Inventor: Günther C. Leussler, Hamburg, Fed. Rep. of Germany

[73] Assignee: U.S. Philips Corporation, New York, N.Y.

[21] Appl. No.: 788,671

[22] Filed: Nov. 6, 1991

[30] Foreign Application Priority Data

Nov. 10, 1990 [DE] Fed. Rep. of Germany ....... 4035844

[51] Int. Cl.⁵ ............................................. G01R 33/20
[52] U.S. Cl. .................................... 324/318; 324/322
[58] Field of Search ............... 324/300, 309, 310, 307, 324/311, 312, 313, 314, 318, 322; 128/653.5, 653.2

[56] References Cited

U.S. PATENT DOCUMENTS

| | | | |
|---|---|---|---|
| 4,467,282 | 8/1984 | Siebold | 324/309 |
| 4,986,272 | 1/1991 | Riederer | 128/653.2 |
| 4,998,066 | 3/1991 | Wichern et al. | 324/322 |
| 4,999,580 | 3/1991 | Meyer et al. | 324/309 |
| 5,003,265 | 3/1991 | Leussler | 324/318 |

FOREIGN PATENT DOCUMENTS 0141383 5/1985 European Pat. Off. .
4003138 8/1990 Fed. Rep. of Germany .

OTHER PUBLICATIONS

L. Bolinger et al., "A Multiple-Frequency Coil with a Highly Uniform B1 Field", Journal of Magnetic Resonance, vol. 81, No. 1, Jan. 1988, pp. 162-166.

Primary Examiner—Michael J. Tokar

[57] ABSTRACT

Two high-frequency coil systems are concentric with a common symmetry axis and are adapted to be connected to a high-frequency transmitter and/or a high-frequency receiver. The field directions of the systems enclose an angle of 90° with respect to one another. Such a quadrature system can be used as a whole-body coil in a magnetic resonance examination apparatus whose magnetic field extends perpendicular to the longitudinal axis of a patient to be examined. The first high-frequency coil system comprises a plurality of inductively coupled, annular conductor loops mutually offset along the symmetry axis, the second coil system comprising conductors arranged in parallel planes and which enclose the symmetry axis arc-like and which are interconnected via conductors extending parallel to the symmetry axis.

3 Claims, 1 Drawing Sheet

QUADRATURE COIL SYSTEM

FIELD OF THE INVENTION

The invention relates to a quadrature coil system for a magnetic resonance examination apparatus, comprising two high-frequency coil systems which are concentric with respect to a common symmetry axis and which can be connected to a high-frequency transmitter and/or a high-frequency receiver, their field directions enclosing an angle of 90°, with respect to one another.

BACKGROUND OF THE INVENTION

A quadrature coil system of this kind in known from EP-B 71 896. It can be used for receiving spin resonance signals and/or for generating high-frequency magnetic fields. In the receiving mode, the signal-to-noise ratio can be improved by up to 3 dB with respect to reception utilizing only one of these coils. In the transmission mode, circularly polarized magnetic high-frequency fields can be generated by supplying the two high-frequency coils with high-frequency currents whose phase has been shifted 90° with respect to one another, so that the required transmission power is halved.

The two high-frequency coil systems of the known system are formed by saddle-shaped coils which have been rotated through 90° with respect to one another, so that their field directions (i.e. the direction of the magnetic fields to be generated thereby or the direction of a high-frequency magnetic field in which the voltage induced in the coil has a maximum) also enclose an angle of 90°. The saddle-shaped coils are arranged on the surfaces of a cylindrical support and generate magnetic fields which extend perpendicular to the symmetry axis. The steady, uniform magnetic field which is generated in the magnetic resonance examination apparatus and which is a prerequisite for examinations based on magnetic resonance must then extend perpendicular to the field directions of the two saddle-shaped coils, i.e. in the direction of the symmetry axis. Because this symmetry axis must be coincident with the longitudinal axis of a patient being examined, the magnetic field must extend in the direction of the longitudinal axis of the patient.

However, also known are magnetic resonance examination apparatus in which the steady magnetic field extends perpendicularly to the longitudinal axis of the patient. A suitable examination apparatus in this respect is described in a prior German Patent Application P 39 18 743.8. It comprises two similar coil systems, each of which comprises several mutually offset, annular conductor loops which are merely inductively coupled to one another. The conductor loops are situated in planes which intersect at right angles and which extend at an angle of approximately 45° with respect to the longitudinal axis of the patient's body. Therefore, a quadrature coil system of this kind is suitable only for performing examinations of the head or the extremities.

SUMMARY OF THE INVENTION

It is an object of the present invention to provide a quadrature coil system which is suitable for magnetic resonance examination apparatus whose uniform, steady magnetic field extends perpendicular to the longitudinal axis of a patient being examined therein and which can also be used to examinations other than those of the head or extremities.

This object is achieved in accordance with an embodiment the invention in that the first high-frequency coil system comprises a plurality of annular conductor loops which are merely inductively coupled to one another and which are mutually offset along the symmetry axis, the second coil system comprising conductors which are arranged in parallel planes perpendicular to the symmetry axis and which enclose the symmetry axis arc-like and which are interconnected via conductors extending parallel to the symmetry axis.

In accordance with an embodiment the invention, the two high-frequency coil systems which together constitute the quadrature coil system thus have a different construction. The field direction of the first high-frequency coil system extends parallel to the symmetry axis, the field direction of the second high-frequency coil system extending perpendicular to the symmetry axis. However, both high-frequency coil systems are concentrically arranged with respect to the symmetry axis, and therefore they can also be used as a whole-body quadrature coil when they are suitably proportioned. Rotation of the second high-frequency coil system enables the quadrature coil system in accordance with the invention to be used in the case of a vertical steady magnetic field as well as in the case of a horizontal steady magnetic field.

The second high-frequency coil system may be formed by a saddle-shaped coil. In a preferred version of the invention, however, the second high-frequency coil system comprises two conductor loops which are arranged in planes perpendicular to the symmetry axis and which are interconnected via conductors, reactance elements being inserted in the conductor loop portions between two neighboring conductors and/or in the conductors. A high-frequency coil system of this kind is often referred to as a "bird cage coil" in which the reactance elements are included only in the conductors and have a capacitive effect. In comparison with saddle-shaped coils, the quality factor can thus be increased.

BRIEF DESCRIPTION OF THE DRAWINGS

The invention will be described in detail hereinafter with reference to the drawing. Therein.

DESCRIPTION OF THE PREFERRED EMBODIMENT

Figure 1:
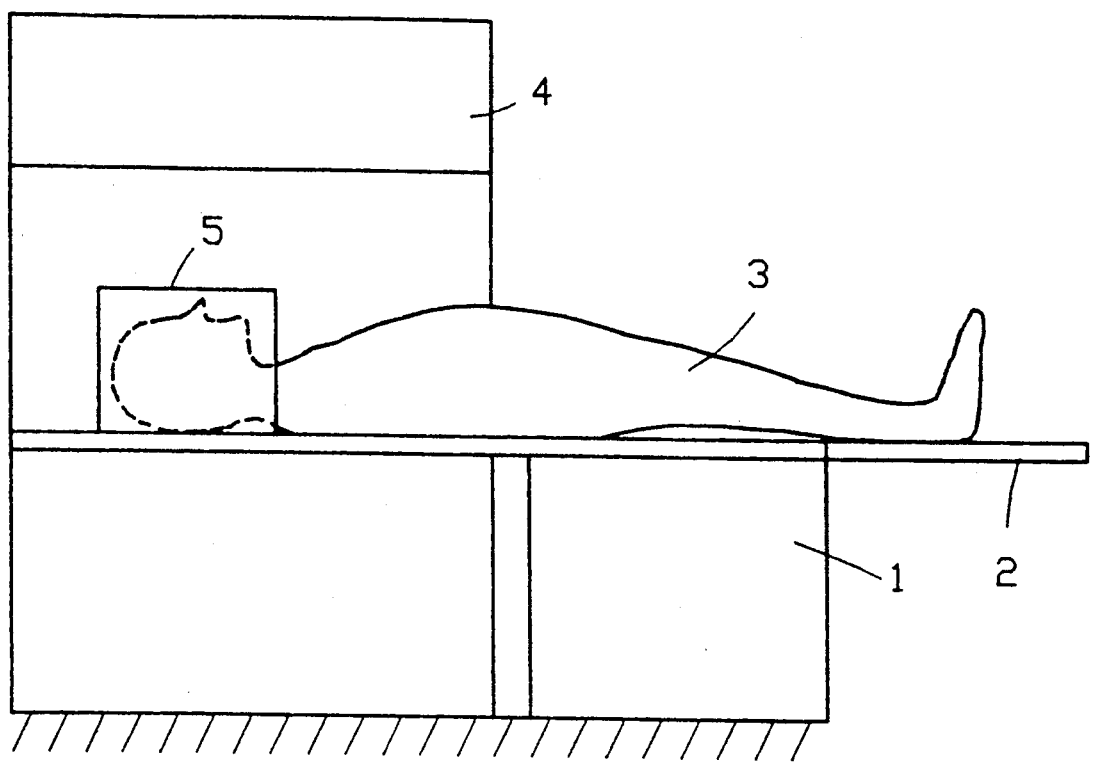
FIG. 1 shows a magnetic resonance examination apparatus in which the invention can be used.

The magnetic resonance examination apparatus shown in FIG. 1 comprises inter alia a patient table 1, a patient 3 being horizontally positioned on the table top 2. It also includes a unit 4 which at least partly encloses the body of the patient. This unit comprises inter alia a magnet for generating a uniform, steady magnetic field in an examination zone in which the patient can be introduced. This magnetic field can extend either vertically or perpendicular with respect to the plane of drawing i.e. in both cases perpendicular to the longitudinal axis of the patient 3. The skull of the patient 3 is enclosed by a cylindrical quadrature coil system 5 which serves to generate high-frequency magnetic fields and/or to receive spin resonance signals.

Figure 2:
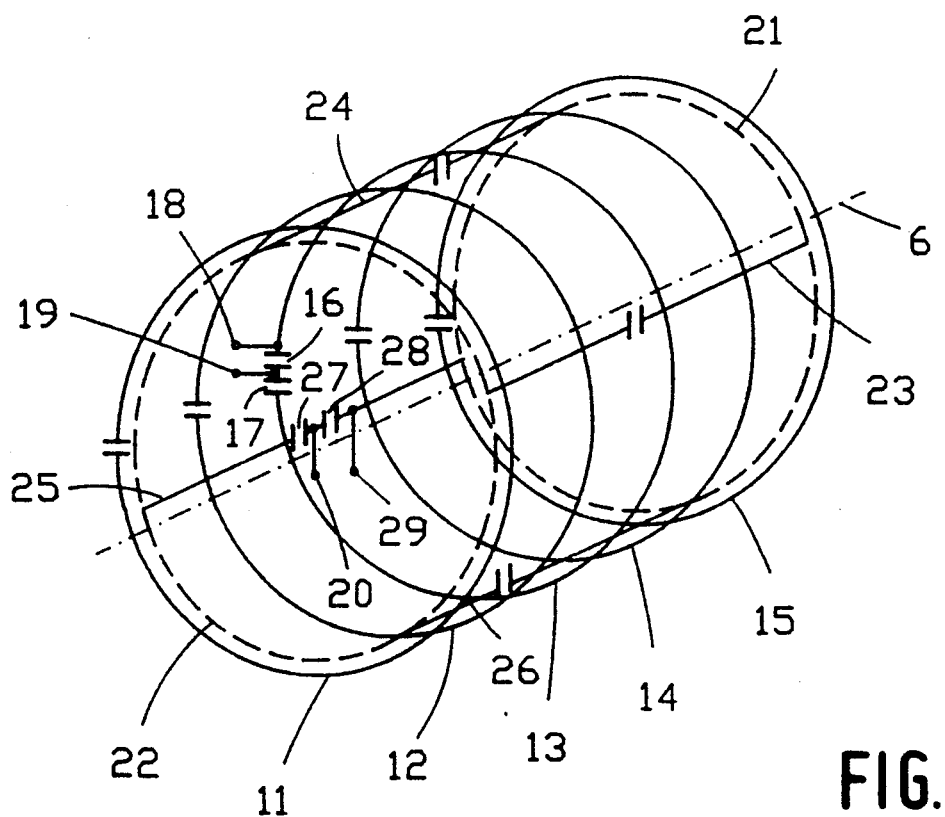
FIG. 2 shows a quadrature coil system in accordance with an embodiment the invention.

As appears from FIG. 2, the quadrature coil system consists of two high-frequency coil systems whose field directions extend perpendicular with respect to the steady magnetic field and enclose an angle of 90° with respect to one another, which coil systems are tuned to the so-called Larmor frequency f. The Larmor frequency f is calculated from the magnetic flux density B of the uniform, steady magnetic field as $$f = cB,$$

where c is the gyromagnetic ratio which amounts to 42.5 MHz/t for protons. In the transmission mode, both high-frequency coil systems receive high-frequency currents of Larmor frequency whose phase has been shifted 90° with respect to one another.

FIG. 2 diagrammatically shows the quadrature coil system, the conductor loops of the second high-frequency coil system being denoted by broken lines for the sake of clarity.

The first high-frequency coil system comprises a number of conductor loops 11 . . . 15 which are arranged in parallel planes at equal distance from one another. The conductor loops 11 . . . 15 have a circular shape and are arranged so as to be concentric with respect to a symmetry axis 6 which extends in the longitudinal direction of the patient during operation of the coil. Each conductor loop includes at least one capacitor, so that each conductor loop forms a part of a respective resonator. These resonators are merely inductively coupled to one another. The first high-frequency coil system has as many oscillation modes as there are resonators. In the oscillation mode with the lowest resonance frequency, the currents in all resonators flow in the same direction. The first high-frequency coil system operates in this oscillation mode. In one of the conductor loops, i.e. the conductor loop 13, two series-connected capacitors 16, 17 are included, the terminals 18 and 19 of one capacitor (16) being connectable to the output of a high-frequency transmitter or to the input of a high-frequency receiver.

A high-frequency coil system of this kind is known from DE-A 3816831; reference is explicitly made to this publication.

The second high-frequency coil system is a so-called bird-cage resonator. Resonators of this kind are known from EP-B 141 383. The resonator comprises two conductor loops 21 and 22 which are denoted by broken lines and which concentrically enclose the symmetry axis 6. These loops are preferably arranged in the same plane as the two extreme conductor loops 11 and 12 and have a diameter which is slightly smaller than that of the extreme loops. They are interconnected via four conductors 23 . . . 26 which extend parallel to the symmetry axis 6 and at least one of which comprises a capacitor. The conductor 25, being connected to the output of a high-frequency transmitter or to the input of a high-frequency receiver, comprises two series-connected capacitors 27 and 28 of the same value, the signal being extracted from the terminals 20 and 29 of one capacitor (28). Thus, connection to a high-frequency transmitter produces a magnetic field which extends perpendicular to the symmetry axis 6 in a plane containing the conductors 24 and 26; however, when the first high-frequency coil system is connected to a high-frequency transmitter, it generates a magnetic field which extends in the direction of the symmetry axis 6.

The two high-frequency coil systems are geometrically and electrically matched. The length of the two coils, being the distance of the planes in which the two conductor loops 21 and 22, or the two extreme conductor loops 11 and 15, are situated, amounts to, for example 25 cm when the system is used as a head coil, the inner diameter of the quadrature coil system amounting to, for example 30 cm for this application. In order to achieve the advantages of a quadrature coil system, the electrical behavior of the two different quadrature coils must be as identical as possible. This means, for example that when voltages of the same value are applied to the terminals 20, 29 or 18, 19, equally strong high-frequency magnetic fields must be generated in the examination zone. To this end, the first high-frequency coil system should comprise eight conductor loops instead of the five conductor loops shown, and the second high-frequency coil system should comprise, instead of the four conductors 23 . . . 26, twelve conductors which are uniformly distributed over the circumference of the conductor loops 21 and 22. Moreover, as appears from FIG. 2, the first high-frequency coil system should enclose the second system because its interaction with an object, for example a head, introduced into the quadrature coil system is stronger than that of the second coil system.

As has already been stated, the field directions of the two high-frequency coil systems extend perpendicular to one another. In the case of an exactly symmetrical construction, therefore, they are decoupled from one another, i.e. a high-frequency magnetic field generated by one of the coils does not produce a signal in the other coil. In practice, however, coupling between the two coils occurs due to the inevitable lack of symmetry, which coupling substantially reduces the signal-to-noise ratio of the quadrature coil system in the receiving mode. In accordance with DE-OS 38 20 168, however, such coupling can be eliminated by means of a variable capacitor which interconnects the two coil systems so that the current caused by the magnetic coupling is compensated for by the current flowing from one coil system to the other via the capacitor. To this end, the variable capacitor is connected on the one side, for example to the connection terminal 18 which is remote from the junction of the capacitors 16 and 17 and on the other side to the corresponding terminal 29 of the second coil system. Should the magnetic coupling thus be increased, this capacitor is connected to the free terminal of the capacitor (27) (instead of to the terminal (29)) or to the corresponding terminal of the capacitor (17) (instead of to the terminal (18)).

I claim:

1. A quadrature coil system for a magnetic resonance examination apparatus, comprising two high-frequency coil systems which are concentric with respect to a common symmetry axis and adapted to be connected to one of a high-frequency transmitter and a high-frequency receiver, the field directions of the coil systems enclosing an angle of 90° with respect to one another, the first high-frequency coil system comprising a plurality of annular conductor loops inductively coupled to one another and which are mutually offset along the symmetry axis, the second coil system comprising conductors arranged in parallel planes perpendicular to the symmetry axis and which enclose the symmetry axis arc-like and which are interconnected via conductors extending parallel to the symmetry axis.

2. A quadrature coil system as claimed in claim 1, wherein the second high-frequency coil system comprises two conductor loops offset with respect to one another in the direction of the symmetry axis and interconnected via said conductors and reactance elements in the conductor loop portions arranged in one of between two of said conductors and in the conductors.

3. A quadrature coil system as claimed in claim 1, wherein the first high-frequency coil system encloses the second high-frequency coil system.

* * * * *